United States Patent
Lu

(10) Patent No.: US 9,570,618 B1
(45) Date of Patent: Feb. 14, 2017

(54) TFT SUBSTRATE MANUFACTURING METHOD AND TFT SUBSTRATE

(71) Applicant: Shenzhen China Star Optoelectronics Technology Co., Ltd., Shenzhen (CN)

(72) Inventor: Macai Lu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/778,090

(22) PCT Filed: Aug. 24, 2015

(86) PCT No.: PCT/CN2015/087912
§ 371 (c)(1),
(2) Date: Sep. 18, 2015

(51) Int. Cl.
*H01L 29/786* (2006.01)
*H01L 27/12* (2006.01)

(52) U.S. Cl.
CPC ..... *H01L 29/78618* (2013.01); *H01L 27/1222* (2013.01); *H01L 27/1274* (2013.01); *H01L 27/1288* (2013.01); *H01L 29/78675* (2013.01); *H01L 29/78696* (2013.01)

(58) Field of Classification Search
CPC ........... H01L 29/78618; H01L 27/1222; H01L 29/78696; H01L 27/1288; H01L 29/78675; H01L 27/1274

See application file for complete search history.

(56) References Cited

U.S. PATENT DOCUMENTS

2006/0091397 A1* 5/2006 Akimoto ............ H01L 27/3244
257/72

* cited by examiner

*Primary Examiner* — Kyoung Lee
(74) *Attorney, Agent, or Firm* — Leong C. Lei

(57) ABSTRACT

The present invention provides a TFT substrate manufacturing method and a TFT substrate. The TFT substrate manufacturing method of the present invention applies etching to source and drain contact zones of an active layer to have heights thereof lower than a height of a channel zone in the middle and configures the source and drain contact zones in a stepwise form so that charge carriers are affected by an electric field (Vds electric field) that is deviated in a direction away from a poly-silicon/gate insulation layer interface and the migration path thereof is caused to shift away from the poly-silicon/gate insulation layer interface thereby reducing the injection of high energy carriers into the gate insulation layer. Further, due to the formation of the steps in the drain contact zone, the peak intensity of the lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability.

12 Claims, 4 Drawing Sheets

TFT SUBSTRATE MANUFACTURING METHOD AND TFT SUBSTRATE

BACKGROUND OF THE INVENTION

1. Field of the Invention

The present invention relates to the field of display technology, and in particular to a thin-film-transistor (TFT) substrate manufacturing method and a TFT substrate.

2. The Related Arts

Thin-film transistors (TFTs) are currently the primary driving device of liquid crystal displays (LCDs) and active matrix organic light-emitting diodes (AMOLEDs) and are directly related to the development of high performance flat panel display devices. The TFTs have various structures and there are various materials that are used to make the corresponding ones of the TFT structures. Low temperature poly-silicon (LTPS) material is one of the preferred materials. The regular arrangement of atoms of LTPS makes the mobility of charge carriers high. For the liquid crystal displays that are driven by voltage, due to the relatively high mobility that a poly-silicon thin-film transistor may have, driving liquid crystal molecules to rotate can be achieved with a thin-film transistor having a smaller size. This greatly reduces the space occupied by the thin-film transistor and thus increases the light transmitting area and provides increased brightness and resolution. For AMOLEDs that are driven by current, a LTPS TFT may better suit the need for driving current. Hot carrier effect is an important mechanism of failure of metal oxide semiconductor (MOS) devices and with the size of the MOS devices being increasingly reduced, the hot carrier injection effect becomes increasingly severe. Taking P-type metal oxide semiconductor (PMOS) device as an example, holes existing in the channel are acted upon by an intense lateral electric field established between the drain and source terminals to get accelerated and become high energy carriers. The high energy carriers collide the crystal lattice of silicon and generate electron-hole pairs through ionization. The electrons are collected by a substrate to form a substrate current; and most of the holes generated by the collision flow to the drain terminal, while a fraction of the holes are acted upon by a longitudinal electric field to inject into the gate terminal and form a gate current. This phenomenon is referred to as "hot carrier injection".

The hot carriers may cause breaking of energy bonds at the silicon substrate and silicon oxide gate oxide interface and generate an interface state between the silicon substrate and the silicon oxide gate oxide interface, leading to deterioration of device performance, such as threshold voltage, transconductance and linear zone/saturation zone currents, and eventually resulting in failure of the MOS device. The failure of the MOS device generally occurs at the drain terminal first. This is because the charge carriers are accelerated by the electric field in the entire channel and when getting to the drain terminal, the energy of the charge carriers reaches the maximum level. Consequently, the hot carrier injection phenomenon is more severe at the drain terminal. Thus, a hot spot of researches of those working in this field would be to alleviate the damage of a semiconductor device caused by hot carrier injection.

For LTPS TFTs, the charge carrier mobility is around 20-100 times of that of amorphous silicon (a-Si) TFTs and they are readily susceptible to hot carrier injection phenomenon. The charge carriers, when moving in an intense electric field ($>4E10^4$V/cm), may acquire an amount of energy from the electric field that is greater than an amount of energy lost by interaction with the crystal lattice so that the speed of the charge carriers may get higher and higher, eventually resulting in the occurrence of hot carrier injection. To alleviate the damage caused by hot carrier injection, solutions that are commonly adopted are to apply ion injection to form a lightly doped transition zone, such as lightly doped drain (LDD) and gate overlapped lightly doped drain (GOLDD). These solutions, however, are complicated and are readily susceptible to doping deviation to result in failure.

SUMMARY OF THE INVENTION

An object of the present invention is to provide a thin-film transistor (TFT) substrate manufacturing method, which applies etching to source and drain contact zones of an active layer to have heights thereof lower than a height of a channel zone in the middle and configures the source and drain contact zones in a stepwise form so that due to the formation of the steps in the drain contact zone, the peak intensity of the lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability.

Another object of the present invention is to provide a TFT substrate, which alleviates the hot carrier effect, reducing drifting of threshold voltage Vth, and improve reliability of the thin-film transistor.

To achieve the above objects, the present invention provides a TFT substrate manufacturing method, which comprises the following steps:

(1) providing a substrate and sequentially depositing a buffer layer and an amorphous silicon layer on the substrate;

(2) subjecting the amorphous silicon layer to excimer laser annealing or solid phase crystallization to convert the amorphous silicon layer into a low temperature poly-silicon layer and applying a photolithographic process to pattern the low temperature poly-silicon layer to form a first active layer and a second active layer that are spaced from each other;

(3) coating a photoresist layer on the first active layer, the second active layer, and the substrate, subjecting the photoresist layer to exposure and development to expose two end portions of the first active layer, using the photoresist layer as a shielding layer to subject the two end portions of the first active layer to injection of N-type or P-type ion so as to form a first source contact zone and a first drain contact zone respectively at the two end portions of the first active layer; and defining a zone between the first source contact zone and the first drain contact zone as a first channel zone;

(4) subjecting the photoresist layer to ashing and partly etching off the first source contact zone and the first drain contact zone of the first active layer in such a way that heights of the first source contact zone and the first drain contact zone are both less than a height of the first channel zone;

(5) peeling off the photoresist layer, depositing a gate insulation layer on the first active layer, the second active layer, and the substrate, depositing a first metal layer on the gate insulation layer, applying a photolithographic process to pattern the first metal layer in order to form a first gate terminal and a second gate terminal respectively located above and corresponding to the first active layer and the second active layer;

(6) coating a photoresist layer on the first gate terminal and the second gate terminal and subjecting the photoresist layer to exposure and development to expose the second gate terminal and a portion of the gate insulation layer corresponding to the second active layer; using the second gate terminal as a shielding layer to subject two end portions of the second active layer to injection of P-type or N-type ion to form a second source contact zone and a second drain contact zone respectively at the two ends of the second active layer; defining a zone between the second source contact zone and the second drain contact zone as a second channel zone;

(7) peeling off the photoresist layer, depositing an interlayer dielectric layer on the first gate terminal and the second gate terminal, and the gate insulation layer, applying a photolithographic process to pattern the interlayer dielectric layer and the gate insulation layer to form, in the interlayer dielectric layer and the gate insulation layer, first vias respectively corresponding to the first source contact zone and the first drain contact zone and second vias respectively corresponding to the second source contact zone and the second drain contact zone;

(8) depositing a second metal layer on the interlayer dielectric layer and applying a photolithographic process to pattern the second metal layer so as to form a first source terminal, a first drain terminal, a second source terminal, and a second drain terminal, wherein the first source terminal and the first drain terminal are respectively connected through the first vias to the first source contact zone and the first drain contact zone and the second source terminal and the second drain terminal are respectively connected through the second vias to the second source contact zone and the second drain contact zone;

(9) coating a planarization layer on the first source terminal, the first drain terminal, the second source terminal, the second drain terminal, and the interlayer dielectric layer and depositing a passivation layer on the planarization layer and applying a photolithographic process to pattern the planarization layer and the passivation layer to form a third via in the planarization layer and the passivation layer to correspond to the second drain terminal; and

(10) depositing a transparent conductive semiconductor layer on the passivation layer and applying a photolithographic process to pattern the transparent conductive semiconductor layer to form a pixel electrode, wherein the pixel electrode is connected through the third via to the second drain terminal thereby completing the manufacture of a TFT substrate.

Through the etching conducted in step (4), upper surfaces of the first source contact zone and the first drain contact zone become horizontal surfaces or slope surfaces that are lower than an upper surface of the first channel zone so that the upper surfaces of the first source contact zone and the first drain contact zone each form a step with respect to the upper surface of the first channel zone;

or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces.

In step (4), oxygen is applied to ash the photoresist layer and, in the oxygen gas, an etchant gas that is active to poly-silicon is mixed to etch the first source contact zone and the first drain contact zone;

or alternatively, oxygen is first applied to ash the photoresist layer and then, a photolithographic process is conducted to etch the first source contact zone and the first drain contact zone.

Injection of N-type ion to the first source contact zone and the first drain contact zone is conducted in step (4) and injection of P-type ion to the second source contact zone and the second drain contact zone is conducted in step (6);

or injection of P-type ion to the first source contact zone and the first drain contact zone is conducted in step (4) and injection of N-type ion to the second source contact zone and the second drain contact zone is conducted in step (6).

The N-type ion is phosphorous ion and the P-type ion is boron ion.

The present invention also provides a TFT substrate, which comprises: a substrate, a buffer layer formed on the substrate, a first active layer and a second active layer formed on the buffer layer, a gate insulation layer formed on the first active layer and the second active layer, a first gate terminal and a second gate terminal formed on the gate insulation layer and respectively corresponding to the first active layer and the second active layer, an interlayer dielectric layer formed on the first gate terminal and the second gate terminal, a first source terminal, a first drain terminal, a second source terminal, and a second drain terminal formed on the interlayer dielectric layer, a planarization layer formed on the first source terminal, the first drain terminal, the second source terminal, and the second drain terminal, a passivation layer formed on the planarization layer, and a pixel electrode formed on the passivation layer;

wherein the first active layer and the second active layer are both low temperature poly-silicon layers;

the first active layer comprises a first channel zone located in a middle thereof and a first source contact zone and a first drain contact zone respectively located on opposite sides of the first channel zone, the first source contact zone and the first drain contact zone having heights that are less than a height of the first channel zone; and the second active layer comprises a second channel zone located in a middle portion thereof and exactly corresponding to the second gate terminal and a second source contact zone and a second drain contact zone respectively located on opposite sides of the second channel zone.

The first source contact zone and the first drain contact zone have upper surfaces that are horizontal surfaces or slope surfaces that are lower than an upper surface of the first channel zone so that the upper surfaces of the first source contact zone and the first drain contact zone each form a step with respect to the upper surface of the first channel zone;

or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces.

The first source contact zone and the first drain contact zone are N-type heavily-doped zones and the second source contact zone and the second drain contact zone are P-type heavily-doped zones;

or alternatively, the first source contact zone and the first drain contact zone are P-type heavily-doped zones and the second source contact zone and the second drain contact zones are N-type heavily-doped zones.

Impurity for doping of the N-type heavily-doped zones comprises phosphorous ion and impurity for doping of the P-type heavily-doped zones comprises boron ion.

The interlayer dielectric layer and the gate insulation layer comprise, formed therein, first vias respectively corresponding to the first source contact zone and the first drain contact zone and second vias respectively corresponding to the second source contact zone and the second drain contact zone, wherein the first source terminal and the first drain terminal are respectively connected through the first vias to the first source contact zone and the first drain contact zone and the second source terminal and the second drain terminal are respectively connected through the second vias to the second source contact zone and the second drain contact zone; and the planarization layer and the passivation layer comprise a third via formed therein and corresponding to the second drain terminal and the pixel electrode is connected through the third via to the second drain terminal.

The present invention further provides a TFT substrate, which comprises: a substrate, a buffer layer formed on the substrate, a first active layer and a second active layer formed on the buffer layer, a gate insulation layer formed on the first active layer and the second active layer, a first gate terminal and a second gate terminal formed on the gate insulation layer and respectively corresponding to the first active layer and the second active layer, an interlayer dielectric layer formed on the first gate terminal and the second gate terminal, a first source terminal, a first drain terminal, a second source terminal, and a second drain terminal formed on the interlayer dielectric layer, a planarization layer formed on the first source terminal, the first drain terminal, the second source terminal, and the second drain terminal, a passivation layer formed on the planarization layer, and a pixel electrode formed on the passivation layer;

wherein the first active layer and the second active layer are both low temperature poly-silicon layers, the first active layer comprises a first channel zone located in a middle thereof and a first source contact zone and a first drain contact zone respectively located on opposite sides of the first channel zone, the first source contact zone and the first drain contact zone having heights that are less than a height of the first channel zone, and the second active layer comprises a second channel zone located in a middle portion thereof and exactly corresponding to the second gate terminal and a second source contact zone and a second drain contact zone respectively located on opposite sides of the second channel zone;

wherein the first source contact zone and the first drain contact zone have upper surfaces that are horizontal surfaces or slope surfaces that are lower than an upper surface of the first channel zone so that the upper surfaces of the first source contact zone and the first drain contact zone each form a step with respect to the upper surface of the first channel zone, or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces;

wherein the first source contact zone and the first drain contact zone are N-type heavily-doped zones and the second source contact zone and the second drain contact zone are P-type heavily-doped zones, or alternatively, the first source contact zone and the first drain contact zone are P-type heavily-doped zones and the second source contact zone and the second drain contact zones are N-type heavily-doped zones; and wherein the interlayer dielectric layer and the gate insulation layer comprise, formed therein, first vias respectively corresponding to the first source contact zone and the first drain contact zone and second vias respectively corresponding to the second source contact zone and the second drain contact zone, wherein the first source terminal and the first drain terminal are respectively connected through the first vias to the first source contact zone and the first drain contact zone and the second source terminal and the second drain terminal are respectively connected through the second vias to the second source contact zone and the second drain contact zone, and the planarization layer and the passivation layer comprise a third via formed therein and corresponding to the second drain terminal and the pixel electrode is connected through the third via to the second drain terminal.

The efficacy of the present invention is that the present invention provides a TFT substrate manufacturing method, which applies etching to source and drain contact zones of an active layer to have heights thereof lower than a height of a channel zone in the middle and configures the source and drain contact zones in a stepwise form so that charge carriers are affected by an electric field (Vds electric field) that is deviated in a direction away from a poly-silicon/gate insulation layer interface and the migration path thereof is caused to shift away from the poly-silicon/gate insulation layer interface thereby reducing the injection of high energy carriers into the gate insulation layer. Further, due to the formation of the steps in the drain contact zone, the peak intensity of the lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability. A TFT substrate according to the present invention is structured to have the heights of source and drain contact zones of an active layer lower than a height of a channel zone in the middle and to configure the source and drain contact zones in a stepwise form so that the peak intensity of a lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
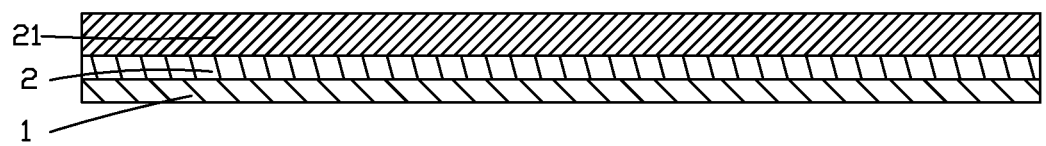
FIG. 1 is a schematic view illustrating a first step of a thin-film transistor (TFT) substrate manufacturing method according to the present invention.

Referring to FIGS. 1-10, firstly, the present invention provides a thin-film transistor (TFT) substrate manufacturing method, which comprises the following steps:

Step 1: as shown in FIG. 1, providing a substrate 1 and sequentially depositing a buffer layer 2 and an amorphous silicon layer 21 on the substrate 1.

Specifically, the buffer layer 2 can be a silicon oxide ($SiO_x$) layer, a silicon nitride ($SiN_x$) layer, or a stacked combination of a silicon oxide layer and a silicon nitride layer.

Figure 2:
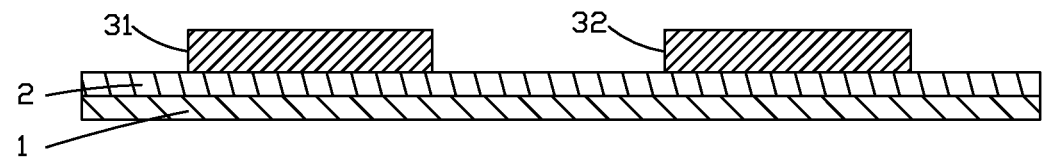
FIG. 2 is a schematic view illustrating a second step of the TFT substrate manufacturing method according to the present invention.

Step 2: as shown in FIG. 2, subjecting the amorphous silicon layer 21 to excimer laser annealing (ELA) or solid phase crystallization (SPC) to convert the amorphous silicon layer into a low temperature poly-silicon layer and applying a photolithographic process to pattern the low temperature poly-silicon layer to form a first active layer 31 and a second active layer 32 that are spaced from each other.

Figure 3:
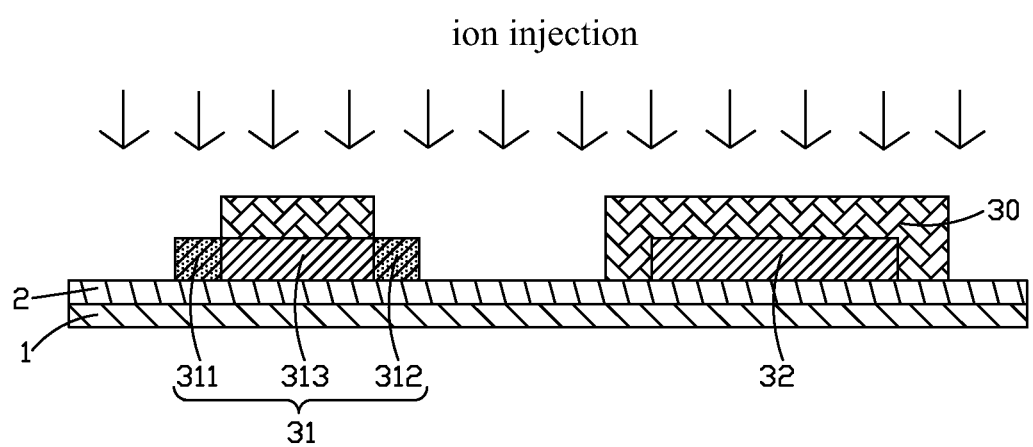
FIG. 3 is a schematic view illustrating a third step of the TFT substrate manufacturing method according to the present invention.

Step 3: as shown in FIG. 3, coating a photoresist layer 30 on the first active layer 31, the second active layer 32, and the substrate 1, subjecting the photoresist layer 30 to exposure and development to expose two end portions of the first active layer 31, using the photoresist layer 30 as a shielding layer to subject the two end portions of the first active layer 31 to injection of N-type or P-type ion so as to form a first source contact zone 311 and a first drain contact zone 312 respectively at the two end portions of the first active layer 31; and defining a zone between the first source contact zone 311 and the first drain contact zone 312 as a first channel zone 313.

Specifically, the N-type ion can be pentavalent ion, such as phosphorous ion, and the P-type ion can be trivalent ion, such as boron ion.

Figure 4:
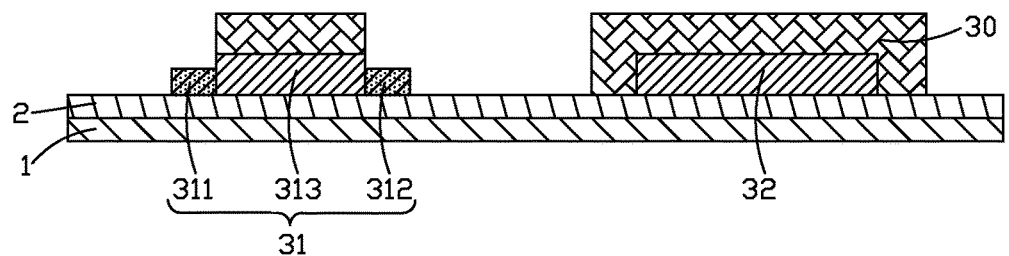
FIG. 4 is a schematic view illustrating a fourth step of the TFT substrate manufacturing method according to the present invention.

Step 4: as shown in FIG. 4, subjecting the photoresist layer 30 to ashing and partly etching off the first source contact zone 311 and the first drain contact zone 312 of the first active layer 31 in such a way that heights of the first source contact zone 311 and the first drain contact zone 312 are both less than a height of the first channel zone 313.

Specifically, through the etching operation of Step 4, upper surfaces of the first source contact zone 311 and the first drain contact zone 312 become horizontal surfaces (as shown in FIG. 4) or slope surfaces that are lower than an upper surface of the first channel zone 313. In other words, the upper surfaces of the first source contact zone 311 and the first drain contact zone 312 each form a step with respect to the upper surface of the first channel zone 313. The step surface shows a height difference of 10-1000 Å from the upper surface of and the first channel zone 313;

or alternatively, the upper surfaces of the first source contact zone 311 and the first drain contact zone 312 each comprise a plurality of steps of which the heights are reduced stepwise in a direction from the first channel zone 313 to the outside. These steps have step surfaces that are horizontal surfaces or slope surfaces and the height difference between two adjacent step surfaces is 10-1000 Å.

Specifically, the ashing treatment of the photoresist layer 30 and the etching operation of first source contact zone 311 and the first drain contact zone 312 can be carried out simultaneously. For example, oxygen is applied to ash the photoresist layer 55 and, in the oxygen gas, an etchant gas that is active to poly-silicon is mixed to etch the first source contact zone 311 and the first drain contact zone 312.

Specifically, the ashing treatment of the photoresist layer 30 and the etching operation of first source contact zone 311 and the first drain contact zone 312 can be carried out separately in two stages. For example, oxygen is first applied to ash the photoresist layer 30 and then, other measures, such as a photolithographic process, are conducted to etch the first source contact zone 311 and the first drain contact zone 312.

Figure 5:
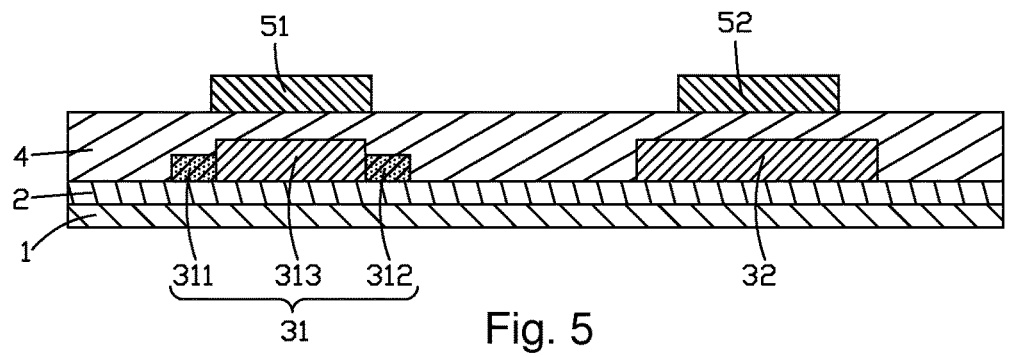
FIG. 5 is a schematic view illustrating a fifth step of the TFT substrate manufacturing method according to the present invention.

Step 5: as shown in FIG. 5, peeling off the photoresist layer 30, depositing a gate insulation layer 4 on the first active layer 31, the second active layer 32, and the substrate 1, depositing a first metal layer on the gate insulation layer 4, applying a photolithographic process to pattern the first metal layer in order to form a first gate terminal 51 and a second gate terminal 52 respectively located above and corresponding to the first active layer 31 and the second active layer 32.

Specifically, the gate insulation layer 4 can be a silicon oxide layer, a silicon nitride layer, or a stacked combination of a silicon oxide layer and a silicon nitride layer.

Specifically, the first metal layer can be a composite layer structure comprising an aluminum layer interposed between two molybdenum layers (Mo/Al/Mo), or alternatively, a composite layer structure comprising an aluminum layer interposed between two titanium layers (Ti/Al/Ti).

Figure 6:
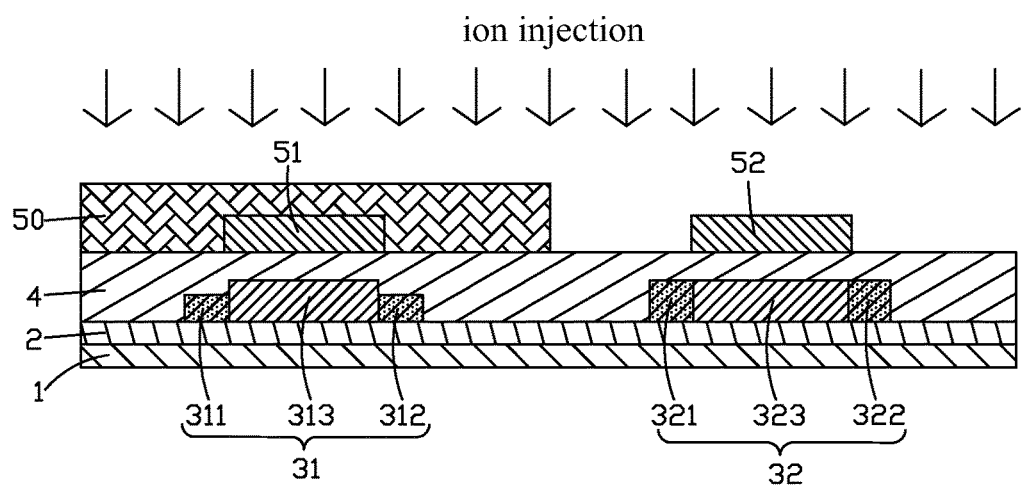
FIG. 6 is a schematic view illustrating a sixth step of the TFT substrate manufacturing method according to the present invention.

Step 6: as shown in FIG. 6, coating a photoresist layer 50 on the first gate terminal 51 and the second gate terminal 52 and subjecting the photoresist layer 50 to exposure and development to expose the second gate terminal 52 and a portion of the gate insulation layer 4 corresponding to the second active layer 32; using the second gate terminal 52 as a shielding layer to subject two end portions of the second active layer 32 to injection of P-type or N-type ion to form a second source contact zone 321 and a second drain contact zone 322 respectively at the two ends of the second active layer 32; defining a zone between the second source contact zone 321 and the second drain contact zone 322 as a second channel zone 323.

Specifically, the N-type ion can be pentavalent ion, such as phosphorous ion, and the P-type ion can be trivalent ion, such as boron ion.

Specifically, when N-type ion is injected into the first source contact zone 311 and the first drain contact zone 312 in Step 4, P-type ion is injected to the second source contact zone 321 and the second drain contact zone 322 in Step 6; when P-type ion is injected to the first source contact zone 311 and the first drain contact zone 312 in Step 4, N-type ion is injected to the second source contact zone 321 and the second drain contact zone 322 in Step 6.

Figure 7:
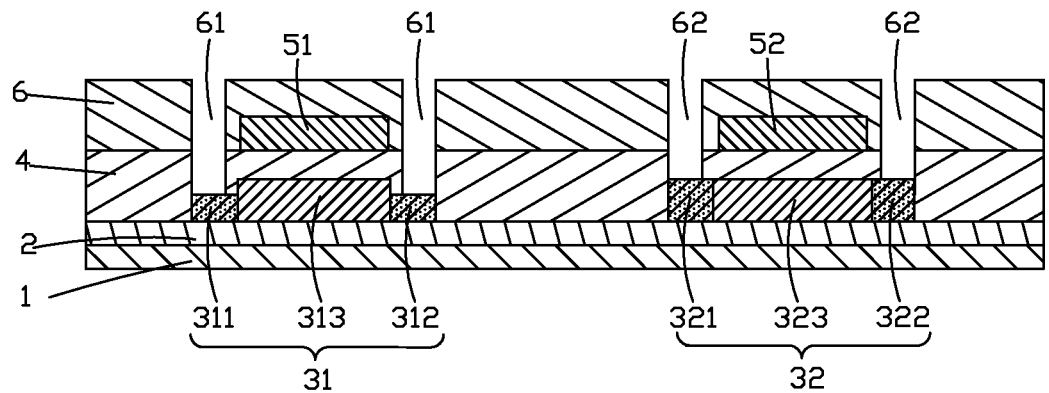
FIG. 7 is a schematic view illustrating a seventh step of the TFT substrate manufacturing method according to the present invention.

Step 7: as shown in FIG. 7, peeling off the photoresist layer 50, depositing an interlayer dielectric layer 6 on the first gate terminal 51 and the second gate terminal 52, and the gate insulation layer 4, applying a photolithographic process to pattern the interlayer dielectric layer 6 and the gate insulation layer 4 to form, in the interlayer dielectric layer 6 and the gate insulation layer 4, first vias 61 respectively corresponding to the first source contact zone 311 and the first drain contact zone 312 and second vias 62 respectively corresponding to the second source contact zone 321 and the second drain contact zone 322.

Figure 8:
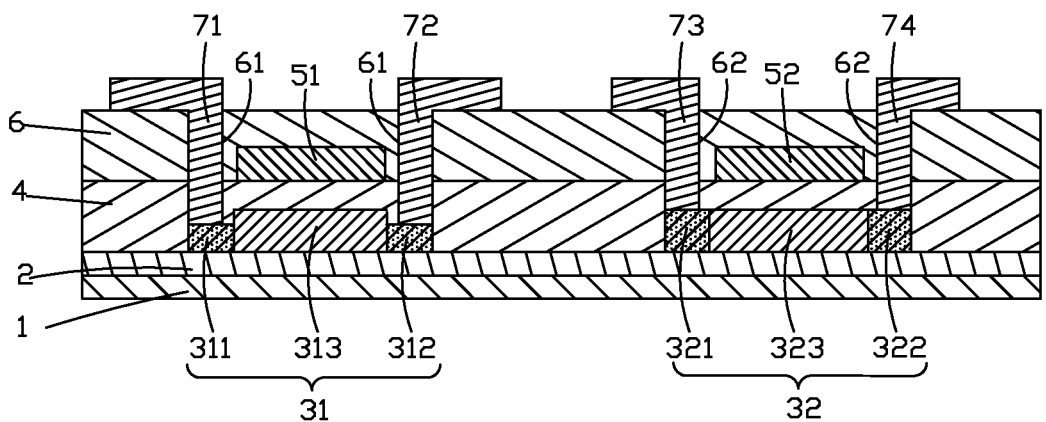
FIG. 8 is a schematic view illustrating an eighth step of the TFT substrate manufacturing method according to the present invention.

Step 8: as shown in FIG. 8, depositing a second metal layer on the interlayer dielectric layer 6 and applying a photolithographic process to pattern the second metal layer so as to form a first source terminal 71, a first drain terminal 72, a second source terminal 73, and a second drain terminal 74, wherein the first source terminal 71 and the first drain terminal 72 are respectively connected through the first vias 61 to the first source contact zone 311 and the first drain contact zone 312 and the second source terminal 73 and the second drain terminal 74 are respectively connected through the second vias 62 to the second source contact zone 321 and the second drain contact zone 322.

Specifically, the second metal layer can be a composite layer structure comprising an aluminum layer interposed between two molybdenum layers (Mo/Al/Mo), or alternatively a composite layer structure comprising an aluminum layer interposed between two titanium layers (Ti/Al/Ti).

Figure 9:
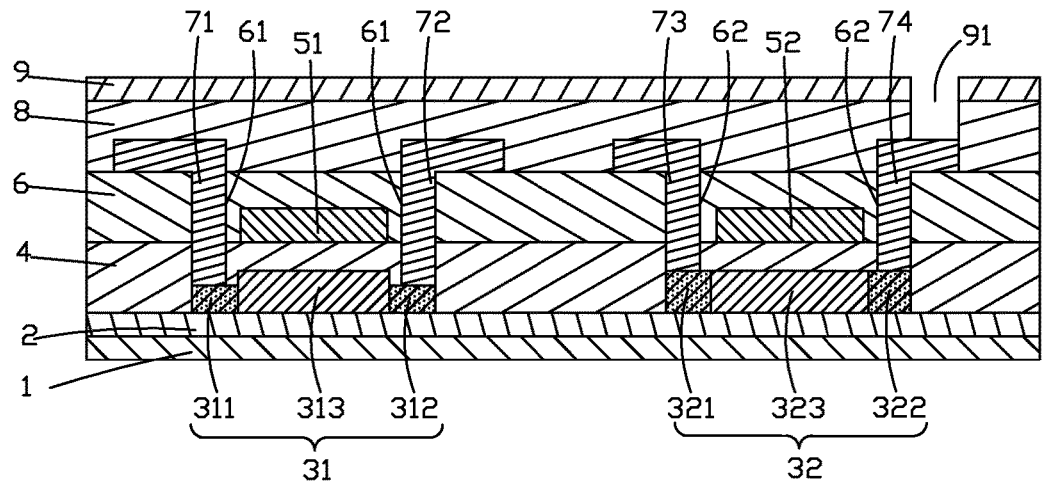
FIG. 9 is a schematic view illustrating a ninth step of the TFT substrate manufacturing method according to the present invention.

Step 9: as shown in FIG. 9, coating a planarization layer 8 on the first source terminal 71, the first drain terminal 72, the second source terminal 73, the second drain terminal 74, and the interlayer dielectric layer 6 and depositing a passivation layer 9 on the planarization layer 8 and applying a photolithographic process to pattern the planarization layer 8 and the passivation layer 9 to form a third via 91 in the planarization layer 8 and the passivation layer 9 to correspond to the second drain terminal 74.

Figure 10:
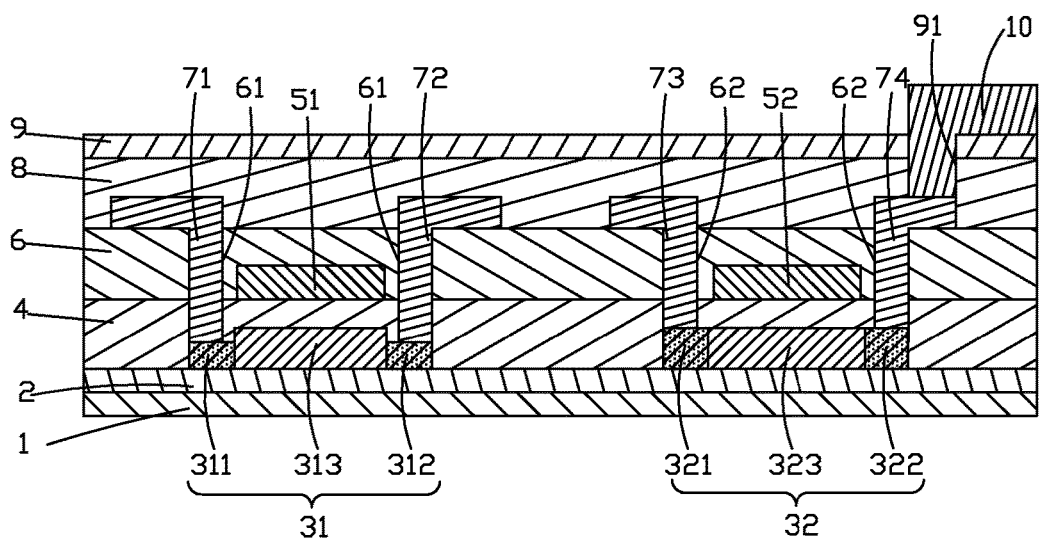
FIG. 10 is a schematic view illustrating a tenth step of the TFT substrate manufacturing method according to the present invention and is also a schematic view illustrating a structure of a TFT substrate according to the present invention.

Step 10: as shown in FIG. 10, depositing a transparent conductive semiconductor layer on the passivation layer 9 and applying a photolithographic process to pattern the transparent conductive semiconductor layer to form a pixel electrode 10, wherein the pixel electrode 10 is connected through the third via 91 to the second drain terminal 74 thereby completing the manufacture of a TFT substrate.

Specifically, the transparent conductive semiconductor layer is formed of a material of ITO (Indium Tin Oxide).

Referring to FIG. 10, based on the TFT substrate manufacturing method described above, the present invention also provides a TFT substrate, which comprises: a substrate 1, a buffer layer 2 formed on the substrate 1, a first active layer 31 and a second active layer 32 formed on the buffer layer 2, a gate insulation layer 4 formed on the first active layer 31 and the second active layer 32, a first gate terminal 51 and a second gate terminal 52 formed on the gate insulation layer 4 and respectively corresponding to the first active layer 31 and the second active layer 32, an interlayer dielectric layer 6 formed on the first gate terminal 51 and the second gate terminal 52, a first source terminal 71, a first drain terminal 72, a second source terminal 73, and a second drain terminal 74 formed on the interlayer dielectric layer 6, a planarization layer 8 formed on the first source terminal 71, the first drain terminal 72, the second source terminal 73, and the second drain terminal 74, a passivation layer 9 formed on the planarization layer 8, and a pixel electrode 10 formed on the passivation layer 9.

Specifically, the first active layer 31 and the second active layer 32 are both low temperature poly-silicon layers.

Specifically, the first active layer 31 comprises a first channel zone 313 located in a middle thereof and a first source contact zone 311 and a first drain contact zone 312 respectively located on opposite sides of the first channel zone 313. The first source contact zone 311 and the first drain contact zone 312 have heights that are less than a height of the first channel zone 313.

Specifically, the first source contact zone 311 and the first drain contact zone 312 have upper surfaces that are horizontal surfaces (as shown in FIG. 10) or slope surfaces that are lower than an upper surface of the first channel zone 313. In other words, the upper surfaces of the first source contact zone 311 and the first drain contact zone 312 each form a step with respect to the upper surface of the first channel zone 313. The step surface shows a height difference of 10-1000 Å from the upper surface of and the first channel zone 313;

or alternatively, the upper surfaces of the first source contact zone 311 and the first drain contact zone 312 each comprise a plurality of steps of which the heights are reduced stepwise in a direction from the first channel zone 313 to the outside. These steps have step surfaces that are horizontal surfaces or slope surfaces and the height difference between two adjacent step surfaces is 10-1000 Å.

Specifically, the second active layer 32 comprises a second channel zone 323 located in a middle portion thereof and exactly corresponding to the second gate terminal 52 and a second source contact zone 321 and a second drain contact zone 322 respectively located on opposite sides of the second channel zone 323.

Specifically, the first source contact zone 311 and the first drain contact zone 312 are N-type heavily-doped zones and the second source contact zone 321 and the second drain contact zone 322 are P-type heavily-doped zones;

or alternatively, the first source contact zone 311 and the first drain contact zone 312 are P-type heavily-doped zones and the second source contact zone 321 and the second drain contact zone 322 are N-type heavily-doped zones.

The impurity that is used for doping in the N-type heavily-doped zones can be pentavalent ion, such as phosphorous ion, and the impurity that is used for doping in the P-type heavily-doped zones can be trivalent ion, such as boron ion.

Specifically, the interlayer dielectric layer 6 and the gate insulation layer 4 comprise, formed therein, first vias 61 respectively corresponding to the first source contact zone 311 and the first drain contact zone 312 and second vias 62 respectively corresponding to the second source contact zone 321 and the second drain contact zone 322, wherein the first source terminal 71 and the first drain terminal 72 are respectively connected through the first vias 61 to the first source contact zone 311 and the first drain contact zone 312 and the second source terminal 73 and the second drain terminal 74 are respectively connected through the second vias 62 to the second source contact zone 321 and the second drain contact zone 322.

Specifically, the planarization layer 8 and the passivation layer 9 comprise a third via 91 formed therein and corresponding to the second drain terminal 74. The pixel electrode 10 is connected through the third via 91 to the second drain terminal 74.

Specifically, the buffer layer 2 can be a silicon oxide ($SiO_x$) layer, a silicon nitride ($SiN_x$) layer, or a stacked combination of a silicon oxide layer and a silicon nitride layer.

The first gate terminal 51, the second gate terminal 52, the first source terminal 71, the first drain terminal 72, the second source terminal 73, and the second drain terminal 74 can each be a composite layer structure comprising an aluminum layer interposed between two molybdenum layers (Mo/Al/Mo) or a composite layer structure comprising an aluminum layer interposed between two titanium layers (Ti/Al/Ti).

Specifically, the pixel electrode 10 is formed of a material of ITO (Indium Tin Oxide).

In summary, the present invention provides a TFT substrate manufacturing method, which applies etching to source and drain contact zones of an active layer to have heights thereof lower than a height of a channel zone in the middle and configures the source and drain contact zones in a stepwise form so that charge carriers are affected by an electric field (Vds electric field) that is deviated in a direction away from a poly-silicon/gate insulation layer interface and the migration path thereof is caused to shift away from the poly-silicon/gate insulation layer interface thereby reducing the injection of high energy carriers into the gate insulation layer. Further, due to the formation of the steps in the drain contact zone, the peak intensity of the lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability. A TFT substrate according to the present invention is structured to have the heights of source and drain contact zones of an active layer lower than a height of a channel zone in the middle and to configure the source and drain contact zones in a stepwise form so that the peak intensity of a lateral electric field (Vds electric field) around the drain contact zone and the intensity of a longitudinal electric field (Vgs electric field) of the drain contact zone are both reduced, making a pinch-off point shifted toward an edge of the drain contact zone, reducing drifting of threshold voltage, and improving TFT reliability.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate manufacturing method, comprising the following steps:
    (1) providing a substrate and sequentially depositing a buffer layer and an amorphous silicon layer on the substrate;
    (2) subjecting the amorphous silicon layer to excimer laser annealing or solid phase crystallization to convert the amorphous silicon layer into a low temperature poly-silicon layer and applying a photolithographic process to pattern the low temperature poly-silicon layer to form a first active layer and a second active layer that are spaced from each other;
    (3) coating a photoresist layer on the first active layer, the second active layer, and the substrate, subjecting the photoresist layer to exposure and development to expose two end portions of the first active layer, using the photoresist layer as a shielding layer to subject the two end portions of the first active layer to injection of N-type or P-type ion so as to form a first source contact zone and a first drain contact zone respectively at the two end portions of the first active layer; and defining a zone between the first source contact zone and the first drain contact zone as a first channel zone;
    (4) subjecting the photoresist layer to ashing and partly etching off the first source contact zone and the first drain contact zone of the first active layer in such a way that heights of the first source contact zone and the first drain contact zone are both less than a height of the first channel zone;
    (5) peeling off the photoresist layer, depositing a gate insulation layer on the first active layer, the second active layer, and the substrate, depositing a first metal layer on the gate insulation layer, applying a photolithographic process to pattern the first metal layer in order to form a first gate terminal and a second gate terminal respectively located above and corresponding to the first active layer and the second active layer;
    (6) coating a photoresist layer on the first gate terminal and the second gate terminal and subjecting the photoresist layer to exposure and development to expose the second gate terminal and a portion of the gate insulation layer corresponding to the second active layer; using the second gate terminal as a shielding layer to subject two end portions of the second active layer to injection of P-type or N-type ion to form a second source contact zone and a second drain contact zone respectively at the two ends of the second active layer; defining a zone between the second source contact zone and the second drain contact zone as a second channel zone;
    (7) peeling off the photoresist layer, depositing an interlayer dielectric layer on the first gate terminal and the second gate terminal, and the gate insulation layer, applying a photolithographic process to pattern the interlayer dielectric layer and the gate insulation layer to form, in the interlayer dielectric layer and the gate insulation layer, first vias respectively corresponding to the first source contact zone and the first drain contact zone and second vias respectively corresponding to the second source contact zone and the second drain contact zone;
    (8) depositing a second metal layer on the interlayer dielectric layer and applying a photolithographic process to pattern the second metal layer so as to form a first source terminal, a first drain terminal, a second source terminal, and a second drain terminal, wherein the first source terminal and the first drain terminal are respectively connected through the first vias to the first source contact zone and the first drain contact zone and the second source terminal and the second drain terminal are respectively connected through the second vias to the second source contact zone and the second drain contact zone;
    (9) coating a planarization layer on the first source terminal, the first drain terminal, the second source terminal, the second drain terminal, and the interlayer dielectric layer and depositing a passivation layer on the planarization layer and applying a photolithographic process to pattern the planarization layer and the passivation layer to form a third via in the planarization layer and the passivation layer to correspond to the second drain terminal; and
    (10) depositing a transparent conductive semiconductor layer on the passivation layer and applying a photolithographic process to pattern the transparent conductive semiconductor layer to form a pixel electrode, wherein the pixel electrode is connected through the third via to the second drain terminal thereby completing the manufacture of a TFT substrate.

2. The TFT substrate manufacturing method as claimed in claim 1, wherein through the etching conducted in step (4), upper surfaces of the first source contact zone and the first drain contact zone become horizontal surfaces or slope surfaces that are lower than an upper surface of the first channel zone so that the upper surfaces of the first source contact zone and the first drain contact zone each form a step with respect to the upper surface of the first channel zone;

or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces.

3. The TFT substrate manufacturing method as claimed in claim 1, wherein in step (4), oxygen is applied to ash the photoresist layer and, in the oxygen gas, an etchant gas that is active to poly-silicon is mixed to etch the first source contact zone and the first drain contact zone;

or alternatively, oxygen is first applied to ash the photoresist layer and then, a photolithographic process is conducted to etch the first source contact zone and the first drain contact zone.

4. The TFT substrate manufacturing method as claimed in claim 1, wherein injection of N-type ion to the first source contact zone and the first drain contact zone is conducted in step (4) and injection of P-type ion to the second source contact zone and the second drain contact zone is conducted in step (6);

or injection of P-type ion to the first source contact zone and the first drain contact zone is conducted in step (4) and injection of N-type ion to the second source contact zone and the second drain contact zone is conducted in step (6).

5. The TFT substrate manufacturing method as claimed in claim 1, wherein the N-type ion is phosphorous ion and the P-type ion is boron ion.

6. A thin-film transistor (TFT) substrate, comprising: a substrate, a buffer layer formed on the substrate, a first active layer and a second active layer formed on the buffer layer, a gate insulation layer formed on the first active layer and the second active layer, a first gate terminal and a second gate terminal formed on the gate insulation layer and respectively corresponding to the first active layer and the second active layer, an interlayer dielectric layer formed on the first gate terminal and the second gate terminal, a first source terminal, a first drain terminal, a second source terminal, and a second drain terminal formed on the interlayer dielectric layer, a planarization layer formed on the first source terminal, the first drain terminal, the second source terminal, and the second drain terminal, a passivation layer formed on the planarization layer, and a pixel electrode formed on the passivation layer;

wherein the first active layer and the second active layer are both low temperature poly-silicon layers;

the first active layer comprises a first channel zone located in a middle thereof and a first source contact zone and a first drain contact zone respectively located on opposite sides of the first channel zone, the first source contact zone and the first drain contact zone having heights that are less than a height of the first channel zone; and the second active layer comprises a second channel zone located in a middle portion thereof and exactly corresponding to the second gate terminal and a second source contact zone and a second drain contact zone respectively located on opposite sides of the second channel zone.

7. The TFT substrate as claimed in claim 6, wherein the first source contact zone and the first drain contact zone have upper surfaces that are horizontal surfaces or slope surfaces that are lower than an upper surface of the first channel zone so that the upper surfaces of the first source contact zone and the first drain contact zone each form a step with respect to the upper surface of the first channel zone;

or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces.

8. The TFT substrate as claimed in claim 6, wherein the first source contact zone and the first drain contact zone are N-type heavily-doped zones and the second source contact zone and the second drain contact zone are P-type heavily-doped zones;

or alternatively, the first source contact zone and the first drain contact zone are P-type heavily-doped zones and the second source contact zone and the second drain contact zones are N-type heavily-doped zones.

9. The TFT substrate as claimed in claim 8, wherein impurity for doping of the N-type heavily-doped zones comprises phosphorous ion and impurity for doping of the P-type heavily-doped zones comprises boron ion.

10. The TFT substrate as claimed in claim 6, wherein the interlayer dielectric layer and the gate insulation layer comprise, formed therein, first vias respectively corresponding to the first source contact zone and the first drain contact zone and second vias respectively corresponding to the second source contact zone and the second drain contact zone, wherein the first source terminal and the first drain terminal are respectively connected through the first vias to the first source contact zone and the first drain contact zone and the second source terminal and the second drain terminal are respectively connected through the second vias to the second source contact zone and the second drain contact zone; and the planarization layer and the passivation layer comprise a third via formed therein and corresponding to the second drain terminal and the pixel electrode is connected through the third via to the second drain terminal.

11. A thin-film transistor (TFT) substrate, comprising: a substrate, a buffer layer formed on the substrate, a first active layer and a second active layer formed on the buffer layer, a gate insulation layer formed on the first active layer and the second active layer, a first gate terminal and a second gate terminal formed on the gate insulation layer and respectively corresponding to the first active layer and the second active layer, an interlayer dielectric layer formed on the first gate terminal and the second gate terminal, a first source terminal, a first drain terminal, a second source terminal, and a second drain terminal formed on the interlayer dielectric layer, a planarization layer formed on the first source terminal, the first drain terminal, the second source terminal, and the second drain terminal, a passivation layer formed on the planarization layer, and a pixel electrode formed on the passivation layer;

wherein the first active layer and the second active layer are both low temperature poly-silicon layers, the first active layer comprises a first channel zone located in a middle thereof and a first source contact zone and a first drain contact zone respectively located on opposite sides of the first channel zone, the first source contact zone and the first drain contact zone having heights that are less than a height of the first channel zone, and the second active layer comprises a second channel zone located in a middle portion thereof and exactly corresponding to the second gate terminal and a second source contact zone and a second drain contact zone respectively located on opposite sides of the second channel zone;

wherein the first source contact zone and the first drain contact zone have upper surfaces that are horizontal surfaces or slope surfaces that are lower than an upper surface of the first channel zone so that the upper surfaces of the first source contact zone and the first drain contact zone each form a step with respect to the upper surface of the first channel zone, or alternatively, the upper surfaces of the first source contact zone and the first drain contact zone each comprise a plurality of steps having heights reduced stepwise in a direction from the first channel zone to the outside, the steps having step surfaces that are horizontal surfaces or slope surfaces;

wherein the first source contact zone and the first drain contact zone are N-type heavily-doped zones and the second source contact zone and the second drain contact zone are P-type heavily-doped zones, or alternatively, the first source contact zone and the first drain contact zone are P-type heavily-doped zones and the second source contact zone and the second drain contact zones are N-type heavily-doped zones; and wherein the interlayer dielectric layer and the gate insulation layer comprise, formed therein, first vias respectively corresponding to the first source contact zone and the first drain contact zone and second vias respectively corresponding to the second source contact zone and the second drain contact zone, wherein the first source terminal and the first drain terminal are respectively connected through the first vias to the first source contact zone and the first drain contact zone and the second source terminal and the second drain terminal are respectively connected through the second vias to the second source contact zone and the second drain contact zone, and the planarization layer and the passivation layer comprise a third via formed therein and corresponding to the second drain terminal and the pixel electrode is connected through the third via to the second drain terminal.

12. The TFT substrate as claimed in claim 11, wherein impurity for doping of the N-type heavily-doped zones comprises phosphorous ion and impurity for doping of the P-type heavily-doped zones comprises boron ion.

\* \* \* \* \*